(12) United States Patent
Tsuruda

(10) Patent No.: US 6,487,115 B1
(45) Date of Patent: Nov. 26, 2002

(54) NON-VOLATILE SEMICONDUCTOR MEMORY DEVICE WITH WRITING SEQUENCE ENABLING EARLY-STAGE JUDGEMENT OF WRITING

(75) Inventor: Takahiro Tsuruda, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/985,744

(22) Filed: Nov. 6, 2001

(30) Foreign Application Priority Data

May 25, 2001 (JP) ........................................ 2001-157389

(51) Int. Cl.⁷ .............................................. G11C 16/04
(52) U.S. Cl. ............................ 365/185.04; 365/189.01; 365/185.19
(58) Field of Search ...................... 365/185.04, 185.19, 365/191, 189.01, 236, 196

(56) References Cited

U.S. PATENT DOCUMENTS

| | | | |
|---|---|---|---|
| 5,602,789 A | * | 2/1997 | Endoh et al. ................ 365/201 |
| 6,026,014 A | * | 2/2000 | Sato et al. ............. 365/185.03 |
| 6,266,270 B1 | * | 7/2001 | Nobukata .............. 365/185.03 |
| 6,288,940 B1 | * | 9/2001 | Kawamura ............. 365/185.09 |

FOREIGN PATENT DOCUMENTS

| | | |
|---|---|---|
| JP | 10-228784 | 8/1998 |
| JP | 10-228786 | 8/1998 |
| JP | 2000-30500 | 1/2000 |

OTHER PUBLICATIONS

"A 256 Mb Multilevel Flash Memory with 2MB/s Program Rate for Mass Storage Applications", Nozoe et al., 1999 IEEE International Solid–State Circuits Conference.

* cited by examiner

*Primary Examiner*—David Nelms
*Assistant Examiner*—Thong Le
(74) *Attorney, Agent, or Firm*—McDermott, Will & Emery

(57) ABSTRACT

In the data writing sequence, judgement of writing is divided into two stages of judgement 1 and judgement 2. In the judgement 1, it is determined whether the data writing has been completed for at least one of a plurality of memory cells, and in the judgement 2, it is determined whether the data writing has been completed for all the memory cells. Changing the writing conditions for the judgements 1 and 2 enables judgement of the data writing in an early stage.

8 Claims, 11 Drawing Sheets

FIG. 4

| JUDGEMENT 1 | N | tP |
|---|---|---|
| | N<K | T1 |
| JUDGEMENT 2 | K | T2 |
| | N>K | $T2 \times P2^{(N-K)}$ |

FIG. 7

| JUDGEMENT 1 | N | tP |
|---|---|---|
| | N=1 | T1 |
| | 1<N<K | $T1 \times P1^{(N-1)}$ |
| JUDGEMENT 2 | N=K | T2 |
| | N>K | $T2 \times P2^{(N-K)}$ |

FIG. 8

| | N | K | tP |
|---|---|---|---|
| JUDGEMENT 1 | N=1 | | T1 |
| | 1<N<K | | T1×P1$^{(N-1)}$ |
| JUDGEMENT 2 | N=K | K<A | T2 |
| | N>K | | T2×P2$^{(N-K)}$ |
| JUDGEMENT 2 | N=K | A≦K<B | T3 |
| | N>K | | T3×P3$^{(N-K)}$ |
| JUDGEMENT 2 | N=K | B≦K | T4 |
| | N>K | | T4×P4$^{(N-K)}$ |

| JUDGEMENT 2 | K | VWW |
|---|---|---|
| | K<A | VWW1 |
| | A≦K<B | VWW2 |
| | B≦K | VWW3 |

FIG. 13 PRIOR ART

| N | tP |
|---|---|
| N<Y | T1 |
| N=Y | T2 |
| N>Y | $T2 \times P^{(N-Y)}$ |

NON-VOLATILE SEMICONDUCTOR MEMORY DEVICE WITH WRITING SEQUENCE ENABLING EARLY-STAGE JUDGEMENT OF WRITING

BACKGROUND OF THE INVENTION

1. Field of the Invention

The present invention relates to non-volatile semiconductor memory devices, and more particularly to a non-volatile semiconductor memory device that performs data writing for a prescribed unit area at a time.

2. Description of the Background Art

In recent years, a flash memory has come into use as a file storage medium, and storage capacity thereof has been increased. As a way of increasing the storage capacity, a technique for writing data of at least two bits in one cell has been widely discussed.

FIG. 10 is a schematic diagram showing a structure of a memory cell MC in a flash memory.

Referring to FIG. 10, the memory cell MC of the flash memory includes a source 22 and a drain 23 that are $n^+$ regions formed on a p type substrate 21. Memory cell MC further includes a floating gate 24 and a control gate 25. Floating gate 24 and control gate 25 are stacked one on the other on p type substrate 21, insulated from each other by an insulating film 26. In particular, the insulating film between floating gate 24 and control gate 25 is also called an inter-poly insulating film 26a, and the insulating film between floating gate 24 and p type substrate 21 is also called a tunnel insulating film 26b. Accordingly, memory cell MC corresponds to an n channel field effect transistor formed on p type substrate 21.

Control gate 25 is coupled to a word line WL for selecting the memory cell MC. Source 22 and drain 23 are coupled to a source line SL and a bit line BL, respectively.

In memory cell MC of a data erased state as an initial state, an electron 27 is drawn out of floating gate 24.

Specifically, assume that a negative high voltage Vnn and a ground voltage GSS are applied to control gate 25 and source 22, respectively, of memory cell MC. In this case, in the memory cell MC, electron 27 is drawn from floating gate 24 by Fowler-Nordheim tunneling, so that data is erased.

Data writing to memory cell MC is carried out by injection of electron 27 into floating gate 24 by the Fowler-Nordheim tunneling.

Specifically, under a condition where source line SL is open, a high voltage Vpp and ground voltage GSS are applied to control gate 25 and drain 23 via word line WL and bit line BL, respectively. This causes the Fowler-Nordheim tunneling, so that electron 27 is injected to floating gate 24, and thus, data is written therein. If high voltage Vpp and a write inhibit voltage Vdi are applied to control gate 25 and drain 23, respectively, then the data writing is not effected.

Here, the threshold voltage Vth of memory cell MC in the data written state with electron 27 having been injected to floating gate 24 becomes higher than that in the data erased state.

Therefore, when data is written into memory cell MC in the data erased state, the stored data can be read out according to the level of threshold voltage Vth of the memory cell MC. For the data reading, bit line BL is precharged in advance, which is discharged for a prescribed period of time by applying a constant voltage to word line WL coupled to control gate 25, and then, the resulting potential of bit line BL is detected.

Specifically, at the time of data reading, bit line BL is precharged in advance to a prescribed voltage Vdr. Source line SL is provided with ground voltage GSS. A prescribed voltage Vwr for data reading is applied to selected word line WL for a prescribed period of time. Control gate 25 of corresponding memory cell MC is thus set to prescribed voltage Vwr.

When these voltages Vwr and Vdr are properly set taking into account the threshold voltage Vth of memory cell MC with data written therein, memory cell MC would not turn on if data writing has been completed therefor, so that it maintains the precharged charges. On the contrary, memory cell MC would turn on if the data writing has not been completed yet, in which case the precharged charges are discharged via memory cell MC to source line SL, so that the potential of bit line BL is decreased. Detection of the amount of charges remained on bit line BL thereafter enables the data reading.

Thus, according to the degree of injection of electrons 27 to floating gate 24, data can be written into each memory cell MC in a non-volatile manner, and the stored data can be read out.

FIG. 11 shows distribution of threshold voltages Vth of memory cells in a flash memory.

Referring to FIG. 11, a memory cell in the data written state (in distribution 2) with its stored data level being "0" has threshold voltage Vth higher than that of a memory cell in the data erased state (in distribution 1) with its stored data level being "1".

In respective memory cell groups in the data written state and in the data erased state, their threshold voltages Vth exhibit variation (e.g., from Va to Vb in distribution 2). Therefore, to read out data from these memory cells, the data reading level should be set at a level enabling discrimination of the respective threshold voltages Vth in consideration of the variation therein. For example, the data reading level can be set to threshold voltage Va. In this case, the data level of a memory cell with its threshold voltage exceeding Va can be set to "0", and the data level of a memory cell with its threshold voltage not greater than Va can be set to "1".

In the case of multi-valued data of greater than 2 bits, distribution of threshold voltages Vth of the memory cells storing data in various levels should be tighter in consideration of variation thereof. That is, the variation of the threshold voltages in the respective levels of the data writing should be restricted more strictly.

A data writing sequence of a conventional flash memory will now be described with reference to FIG. 12.

Referring again to FIG. 11, assume that a plurality of memory cells in the data erased state (in distribution 1) are made to attain the data written state with their threshold voltages Vth falling within a range between Va (V) and Vb (V).

In a flash memory, a condition of data writing operation is set for each unit writing region that becomes a target of data writing operation at one time (or "unit writing operation"). Hereinafter, the prescribed unit region as the target of the unit writing operation is also referred to as a "sector". One sector corresponds to a memory cell group selected by one word line.

When a data writing command is input, the data writing sequence starts at step S1. Here, the number of times of unit writing operations N is set to 1 (START).

Next, the data writing operation is carried out for each sector (step S1). The data writing condition will now be described.

In general, at the time of unit writing operation in the flash memory, a data writing pulse, or a voltage signal having prescribed voltage amplitude and pulse width, is applied to the control gate of a memory cell. In other words, the condition of the unit writing operation is set by the voltage amplitude VWW and the pulse width or application time tP of the data writing pulse.

Figure 13:
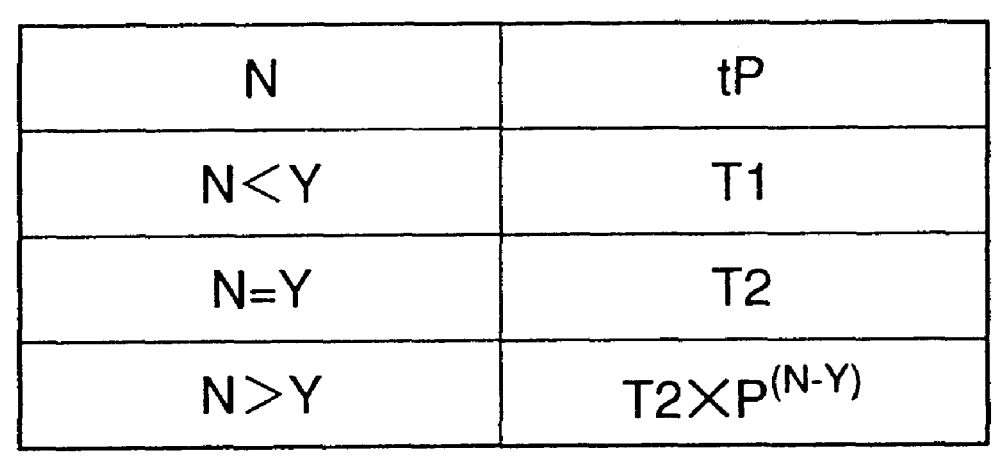

FIG. 13 is a table for use in setting the condition of unit writing operation of the conventional data writing sequence. For example, when the number of times of unit writing operations having been conducted (hereinafter, also referred to as "unit writing operation total") N is less than a prescribed number Y, the application time tP as the unit writing operation condition is set to T1. When unit writing operation total N is equal to prescribed number Y, application time tP is set to T2. When total N is greater than prescribed number Y, application time tP is set to T2×P$^{(N-Y)}$ (T2: initial term, P: power coefficient). Thus, application time tP increases exponentially after unit writing operation total N has exceeded prescribed number Y.

Next, to determine whether the data writing is properly conducted, a prescribed threshold voltage Vth=Va is applied to read data (step S2).

If all the memory cells have attained threshold voltages greater than prescribed level of Va, it is determined that the data writing has been succeeded, so that the data writing sequence is terminated. Otherwise, it is determined NG (no good), and the operation goes to step S4 after setting unit writing operation total N to N+1 (step S3).

In step S4, it is determined whether unit writing operation total N is within a prescribed number K. If the total N has exceeded prescribed number K, it is determined NG and the data writing sequence is terminated. If total N is within prescribed number K, the operation proceeds to step S5.

If the data writing is conducted to the memory cell for which the data writing has already been completed, electrons would be injected excessively, resulting in an over-programmed memory cell. Thus, before resuming the initial step S1, the memory cell for which data writing has been completed is eliminated from the target of the data writing (step S5). The unit writing operation is then conducted again for the memory cells for which the data writing has not yet been completed.

With such a conventional data writing method, however, the speed of data writing would vary for each lot at the end of the wafer process, or it would change through repetition of data erasing and writing. Thus, using the same data writing sequence for every lot would result in failure in the data writing sequence, as threshold voltages Vth of memory cells in some lots might be out of a specific range, e.g., greater than Vb in FIG. 11. In addition, if the data writing is slow in speed, determination of failure would take a long period of time, since the error in data writing would not be found until the sequence is completed.

SUMMARY OF THE INVENTION

The present invention is made to solve the above-described problems, and its object is to provide a non-volatile semiconductor memory device that prevents failure of a data writing sequence and allows judgement of a data writing error in an early stage.

The non-volatile semiconductor memory device of the present invention includes: a memory cell array region having a plurality of memory cells arranged in rows and columns for storing data in a non-volatile manner, a plurality of word lines provided corresponding to the rows of the memory cells, and a plurality of bit lines provided corresponding to the columns of the memory cells; and a control unit controlling data writing for selected ones of the plurality of memory cells corresponding to a selected one of the plurality of word lines as a target of the data writing. The control unit performs: designation of a unit writing operation that is carried out repeatedly for the selected memory cells until the data writing is completed; a first judging operation carried out every time the unit writing operation is finished, for confirmation of as to whether the data writing has been completed for at least one of the selected memory cells; and a second judging operation carried out every time the unit writing operation is finished after the first judging operation has confirmed the completion of the data writing, for confirmation of as to whether the data writing has been completed for all the selected memory cells.

Preferably, the control unit counts the number of times of the designation of the unit writing operation, and terminates the designation of the data writing for the selected memory cells when the number of times of the designation of the unit writing operation repeated until the first judging operation confirms the completion of the data writing has reached a prescribed number.

According to the non-volatile semiconductor memory device above, it is possible to detect failure in data writing in an early stage by performing the first and second judging operations.

Preferably, the non-volatile semiconductor memory device further includes a storage unit for storing a first setting condition of the unit writing operation repeated until the data writing is completed for at least one of the selected memory cells, and a second setting condition of the unit writing operation repeated until the data writing is completed for all the selected memory cells. The first setting condition and the second setting condition are different from each other.

According to the non-volatile semiconductor memory device above, the data writing can be performed rapidly by differentiating the first setting condition of the unit writing operation conducted until the first judging operation is completed and the second setting condition of the unit writing operation conducted until the second judging operation is completed.

Specifically, the control unit counts the number of times of the designation of the unit writing operation, and designates the unit writing operation based on either one of the first and second setting conditions stored in the storage unit. In the storage unit, the first and second setting conditions each include a voltage amplitude of a pulse voltage signal being applied to the selected word line in the unit writing operation, and a voltage application time of the pulse voltage signal. The first setting condition has the constant voltage amplitude and the constant voltage application time. The second setting condition has the constant voltage amplitude and the voltage application time varied according to the number of times of the designation of the unit writing operation.

Alternatively, the control unit counts the number of times of the designation of the unit writing operation, and designates the unit writing operation based on either one of the first and second setting conditions stored in the storage unit. In the storage unit, the first and second setting conditions each include a voltage amplitude of a pulse voltage signal being applied to the selected word line in the unit writing operation, and a voltage application time of the pulse voltage signal. The first setting condition has the constant voltage amplitude and the voltage application time varied according to the number of times of the designation of the unit writing operation. The second setting condition has the constant voltage amplitude and the voltage application time varied according to the number of times of the designation of the unit writing operation.

According to the non-volatile semiconductor memory device above, the voltage application time in each of the first and second setting conditions can be made variable, so that high-precision data writing is enabled.

Alternatively, the non-volatile semiconductor memory device further includes a storage unit for storing a setting condition of the unit writing operation conducted repeatedly, after the first judging operation has confirmed the completion of the data writing, until the data writing for all the selected memory cells is completed. The control unit further counts the number of times of the designation of the unit writing operation, and designates the unit writing operation based on the setting condition, according to the number of times of the designation of the unit writing operation that was necessary for completion of the data writing. of at least one of the selected memory cells.

Specifically, the setting condition stored in the stored unit has a voltage application time of a pulse voltage signal that is applied to the selected word line in the unit writing operation, and a voltage amplitude of the pulse voltage signal varied according to the number of times of the designation of the unit writing operation repeated until the data writing is completed for at least one of the selected memory cells.

Alternatively, the setting condition stored in the stored unit has a voltage amplitude of a pulse voltage signal that is applied to the selected word line in the unit writing operation, and a voltage application time of the pulse voltage signal varied according to the number of times of the designation of the unit writing operation repeated until the data writing is completed for at least one of the selected memory cells.

According to the non-volatile semiconductor memory device above, the characteristic of each lot can be discriminated by the number of times of the designation of the unit writing operation repeated until the completion of the first judging operation, and the setting condition can be changed correspondingly. As a result, high-precision data writing is ensured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a table stored in storage unit 15 for use in setting pulse application time tP according to the number of times of data writing N in an embodiment of the present invention.

FIG. 7 is another table stored in storage unit 15, employed in a first variation of the embodiment.

FIG. 8 is yet another table stored in storage unit 15, employed in a second variation of the embodiment.

FIG. 13 is a table for use in setting a data writing condition of the conventional data writing sequence.

DESCRIPTION OF THE PREFERRED EMBODIMENTS

Figure 1:
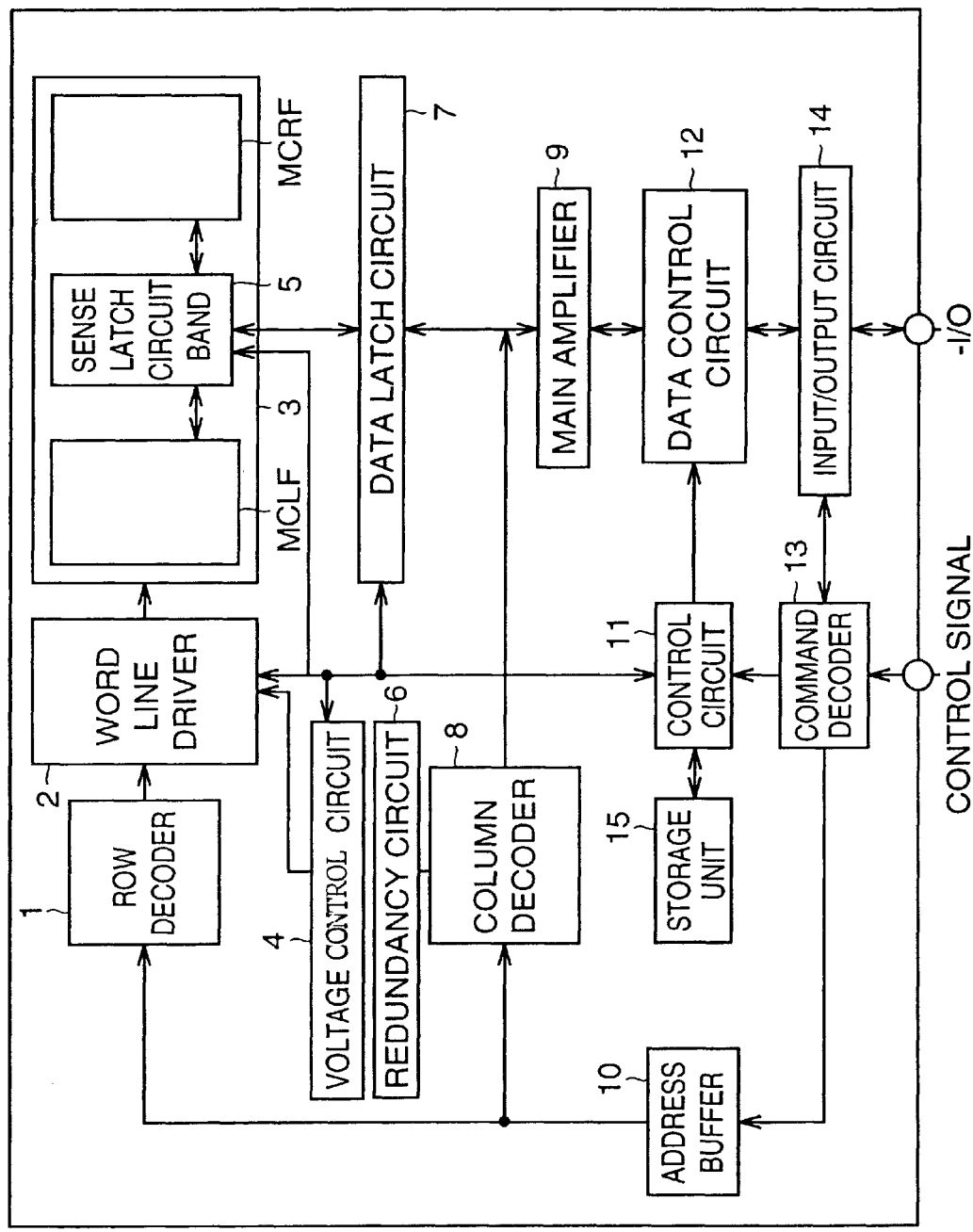
FIG. 1 shows an entire configuration of a non-volatile semiconductor memory device 10000 according to the present invention.

Hereinafter, embodiments of the present invention will be described in detail with reference to the drawings, through which the same or corresponding portions are denoted by the same reference character and description thereof will not be repeated where appropriate.

Referring to FIG. 1, the non-volatile semiconductor memory device 10000 of the present invention includes: a row decoder 1; a word line driver 2; a memory cell array 3; a voltage control circuit 4; a redundancy circuit 6; a data latch circuit 7; a column decoder 8; a main amplifier 9; an address buffer 10; a control circuit 11; a data control circuit 12; a command decoder 13; an input/output circuit 14; and a storage unit 15. Memory cell array 3 includes a memory cell region MCLF, a sense latch circuit band 5, and another memory cell region MCRF.

Memory cell array 3 is formed of memory cells that are connected to word lines and bit lines arranged in rows and columns for storage of data.

Row decoder 1 receives an address signal from address buffer 10 and outputs a signal designating row selection of memory cell array 3 to word line driver 2.

Voltage control circuit 4 generates a signal for control of voltage amplitude of a voltage being applied to a word line of memory cell array 3, and outputs the signal to word line driver 2.

Word line driver 2 receives the signals from row decoder 1 and voltage control circuit 4 and designates a word line of memory cell array 3, and changes the voltage amplitude and pulse width (application time) of the voltage being applied to the word line.

Sense latch circuit band 5 outputs the voltage read out to a bit line at the time of data reading, and, at the time of data writing, latches data for selecting a bit line as a target of the data writing from data latch circuit 7.

Redundancy circuit 6 designates an address of the bit line for substitution of a defective memory cell in memory cell array 3 and outputs the same to column decoder 8.

Data latch circuit 7 latches the data read out from a bit line or the data received from main amplifier 9.

Column decoder 8 receives an address signal from address buffer 10 and provides a designation of column selection to data latch circuit 7.

Main amplifier 9 transfers the data read out from data latch circuit 7. At the time of data writing, it writes data into data latch circuit 7.

Address buffer 10 responds to a command input from command decoder 13 and generates address signals for output to row decoder 1 and column decoder 8.

Control circuit 11 determines an internal sequence for the command input, and controls word line driver 2, voltage control circuit 4, sense latch circuit band 5 and data latch circuit 7 according to the sequence.

Control circuit 11 further effects execution of the data writing sequence based on the conditions stored in storage unit 15 and judgement of the data writing. It also provides a designation for the unit writing operation to voltage control circuit 4 and word line driver 2. Specifically, it designates voltage control circuit 4 and word line driver 2 to set the voltage amplitude and the application time of the pulse to be applied to the word line.

Data control circuit 12 transfers data from main amplifier 9 to input/output circuit 14 after performing appropriate processing. Alternatively, it transfers the data from input/output circuit 14 to main amplifier 9 after the appropriate processing.

Command decoder 13 discriminates command, address and others according to control signals.

Input/output circuit 14 outputs data to or receives data from an input/output pin I/O.

Storage unit 15 stores writing and reading sequences and tables used in the sequences. In the present embodiment, the configurations of the tables used for the sequences have been illustrated. However, besides such tables, mathematical expressions and others for use in the respective sequences may also be stored in storage unit 15.

Figure 2:
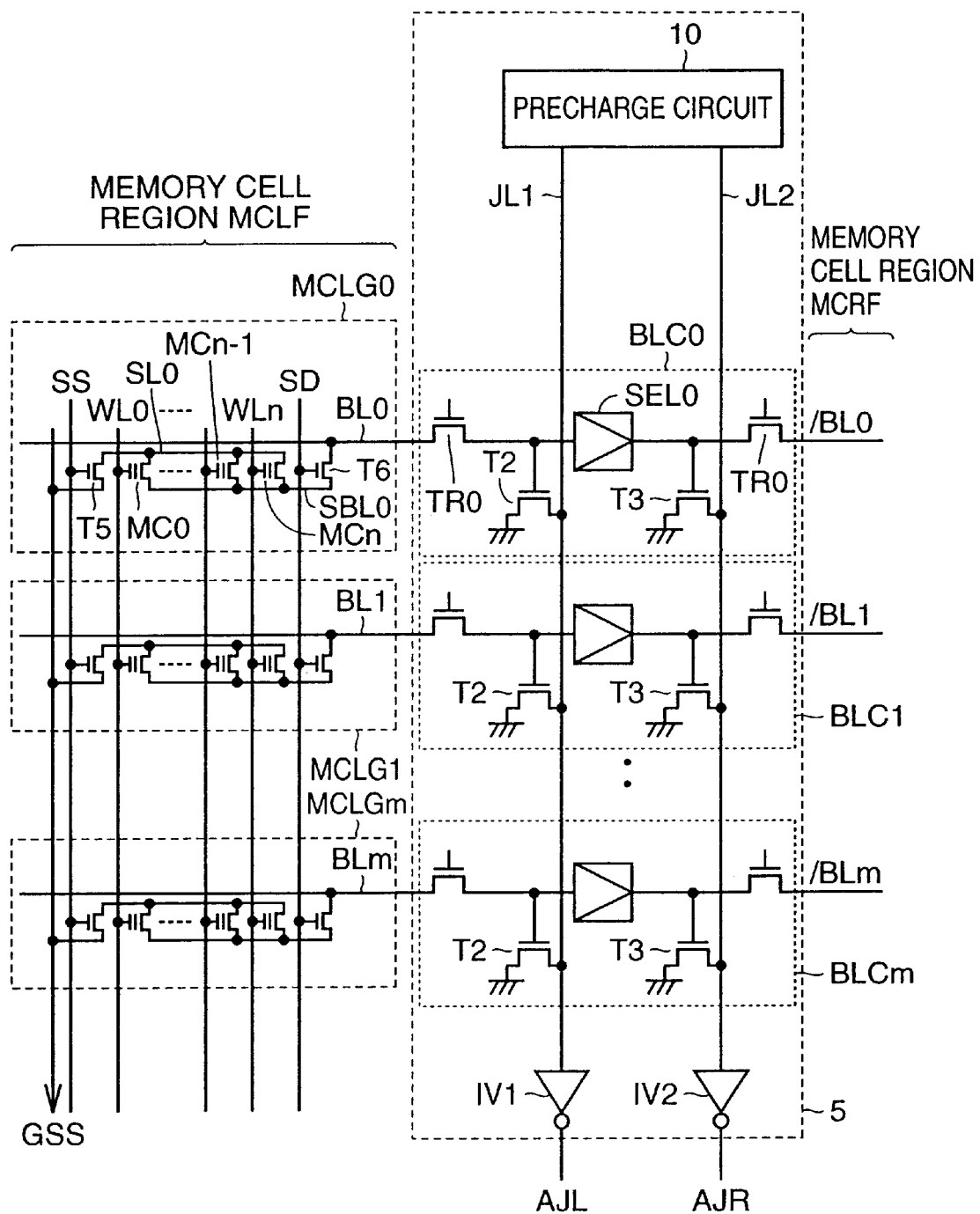
FIG. 2 shows internal circuit configurations of memory cell array 3 and sense latch circuit band 5.

Referring to FIG. 2, arrangement of the bit lines within memory cell array 3 is of an open type. Bit lines BL and /BL complementary to each other constitute a bit line pair.

Memory cell array 3 includes sense latch circuit band 5, and memory cell regions MCLF and MCRF placed on the respective sides of sense latch circuit band 5.

Memory cell regions MCLF and MCRF are identical to each other in configuration. Thus, memory cell region MCLF will be described representatively, and illustration and description of memory cell region MCRF will not be provided.

In memory cell region MCLF, word lines WL0–WLn (n is a natural number) and bit lines BL0–BLm (m is a natural number) are arranged in rows and columns.

The respective word lines are connected to gate electrodes of memory cells MC corresponding to the respective bit lines.

Memory cell region MCLF is formed of row memory cell groups MCLG0–MCLGm (hereinafter, also collectively referred to as "row memory cell group MCLG").

Here, the circuit configuration of row memory cell group MCLG0 will be described representatively, and the rest of row memory cell group MCLG having the same configuration will not be described in detail.

Row memory cell group MCLG0 includes transistors T5 and T6, memory cells MC0–MCn, a source select line SS, a source line SL0, word lines WL0–WLn, a drain select line SD, a bit line BL0, a sub-bit line SBL0, and a ground voltage line GSS.

Each memory cell MC0–MCn has its source connected to source line SL0 and its drain connected to sub-bit line SBL0.

Source select line SS and drain select line SD are arranged in rows in parallel with the word lines.

Transistor T5 is placed between ground voltage line GSS and source line SL0 and has its gate electrode connected to source select line SS.

Transistor T6 is placed between sub-bit line SBL0 and bit line BL0 and has its gate electrode connected to drain select line SD.

Thus, when source select line SS is at an H level, transistor T5 turns on, and ground voltage GSS is transmitted to source line SL0.

When drain select line SD is at an H level, transistor T6 turns on, and sub-bit line SBO and bit line BL0 are electrically connected to each other.

The circuit configuration of sense latch circuit band 5 will now be described.

Sense latch circuit band 5 determines the voltages read out to the bit lines at the time of data reading, and outputs judgement signals AJL and AJR.

Sense latch circuit band 5 includes a precharge circuit 10, bit line control circuits BLC0–BLCm (m is a natural number) (hereinafter, also collectively referred to as "bit line control circuit BLC"), judgement lines JL1 and JL2, and inverters IV1 and IV2.

Precharge circuit 10 precharges judgement lines JL1 and JL2 to a prescribed voltage. Judgement lines JL1 and JL2 are each connected to the respective bit line control circuit BLC, and output judgement signals AJL and AJR through inverters IV1 and IV2, respectively.

Bit line control circuit BLC adjusts the voltage level of the corresponding bit line.

The circuit configuration of the bit line control circuit BLC0 will now be described representatively, and the rest of bit line control circuit BLC having the same configuration will not be described in detail.

Bit line control circuit BLC0 includes transistors TR0, T2 and T3, and a sense latch circuit SEL0.

Sense latch circuit SEL0 is arranged between bit line pair BL0 and /BL0. Transistors TR0 are arranged as gates between respective bit lines BL0 and /BL0 and sense latch circuit SEL0.

Transistor T2 is placed between ground voltage GSS and judgement line JL1, and has its gate electrode electrically connected to bit line BL0.

Transistor T3 is placed between ground voltage GSS and judgement line JL2, and has its gate electrode electrically connected to bit line /BL0.

Sense latch circuit band 5 outputs the signal levels of judgement lines JL1 and JL2 to control circuit 11 as judgement signals AJL and AJR via inverters IV1 and IV2, respectively.

Figure 3:
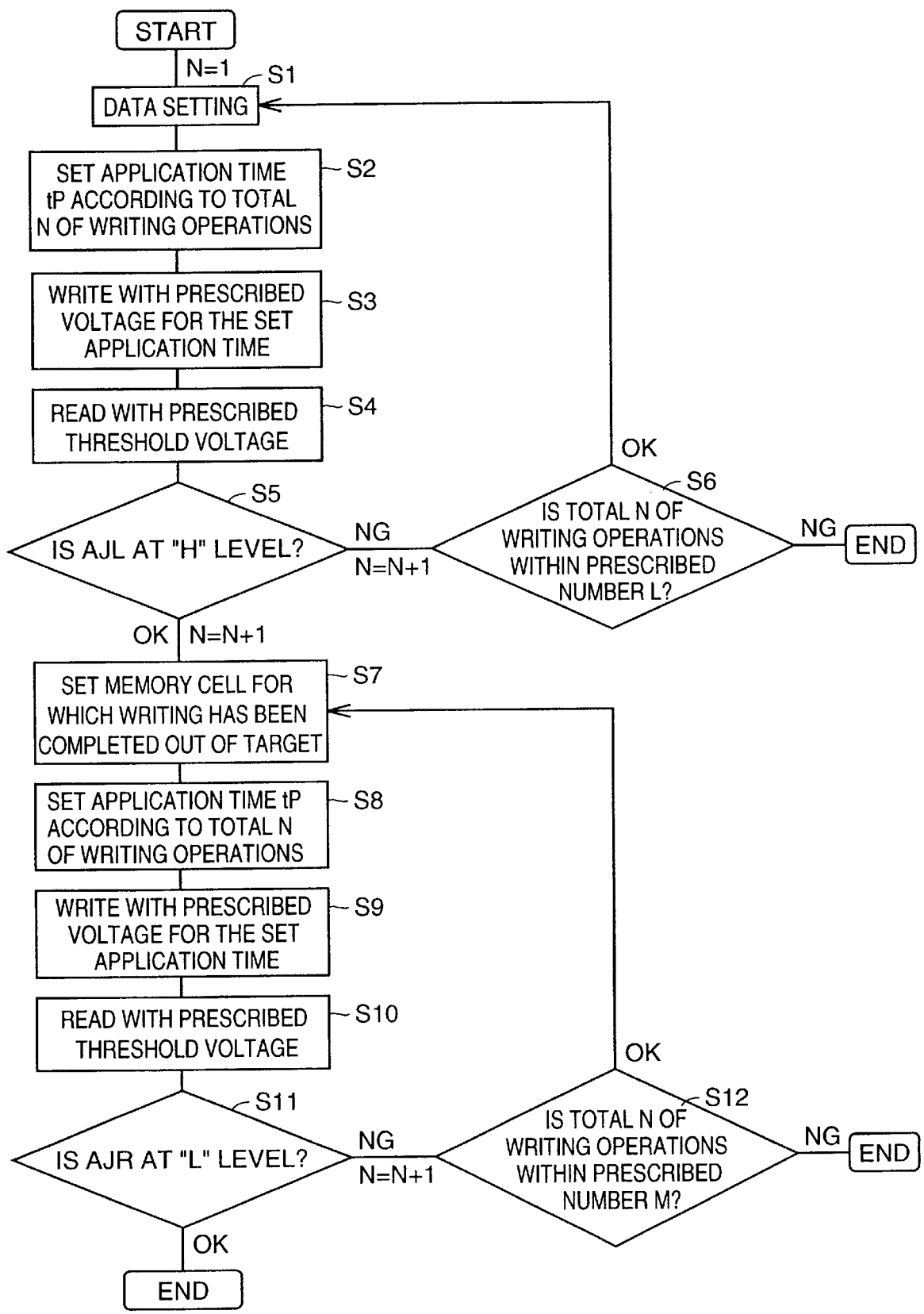
FIG. 3 shows a data writing sequence in accordance with an embodiment of the present invention.

FIG. 3 shows a data writing sequence of an embodiment of the present invention.

Figure 12:
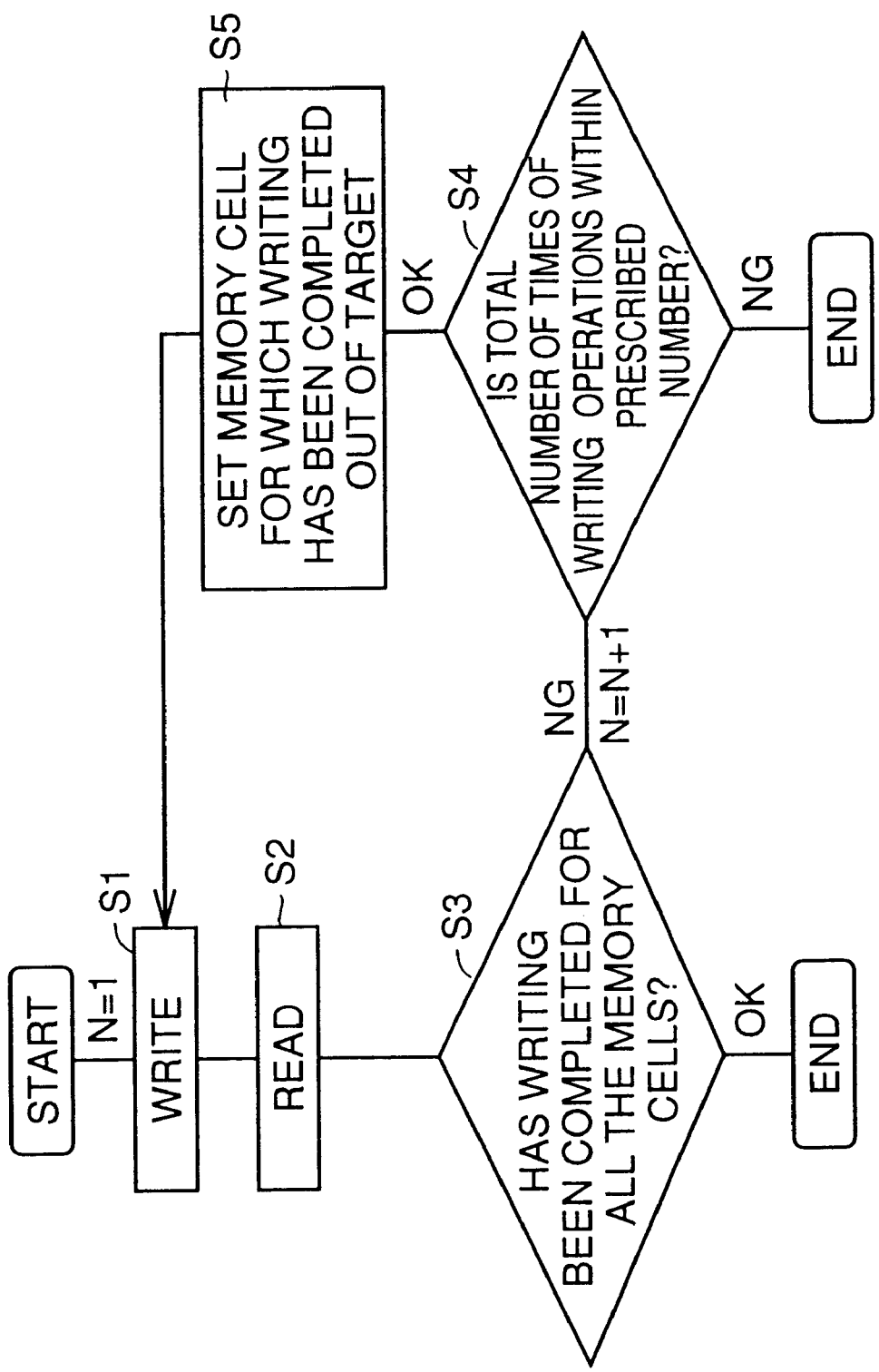
FIG. 12 shows a data writing sequence of a conventional flash memory.

The data writing sequence of the present invention differs from the conventional data writing sequence shown in FIG. 12 in that the sequence is divided into two stages. Specifically, a sequence (judgement 1) for judging whether data writing has been completed for at least one memory cell is additionally provided prior to the sequence (judgement 2) for judging whether data writing has been completed for all the memory cells.

The writing sequence of the present invention effected by control circuit 11 will now be described.

Figure 11:
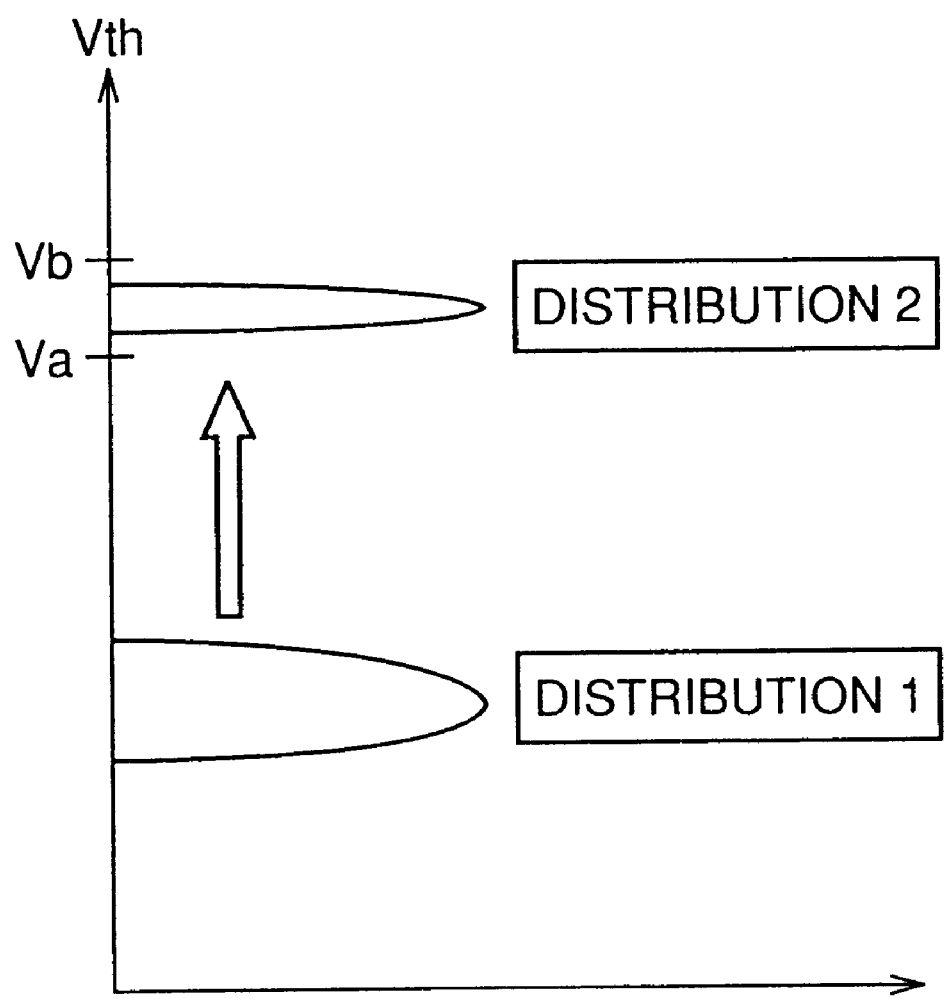
FIG. 11 schematically shows distribution of threshold voltages Vth of the memory cells in the flash memory.

Referring again to FIG. 11, assume that a plurality of memory cells in the data erased state (distribution 1) are to be set to the data written state with their threshold voltages Vth falling in a range from Va (V) to Vb (V).

When a data write command is input, the data writing sequence starts at step S1. Here, the number of times of unit writing operations having been conducted, or the unit writing operation total N is set to 1.

When the data writing sequence starts, the unit writing operation is conducted for each sector. First, data setting is performed, wherein sense latch circuit SEL sets bit line BL connected to a prescribed memory cell within the relevant sector as the target of data writing to a ground voltage GSS level of an L level (step S1).

Next, in order to perform the unit writing operation applying a prescribed voltage, unit writing operation total N is determined, and application time tP of the voltage is set according to the total N (step S2).

Referring to FIG. 4, unit writing operation total N=K represents the number of times of the unit writing operations repeated until the completion of judgement 1. For example, application time tP is set to T1 until judgement 1 is completed at the unit writing operation total of K.

Next, the unit writing operation is carried out for the target memory cells with a prescribed voltage for application time tP set in step S2 (step S3).

Figure 5:
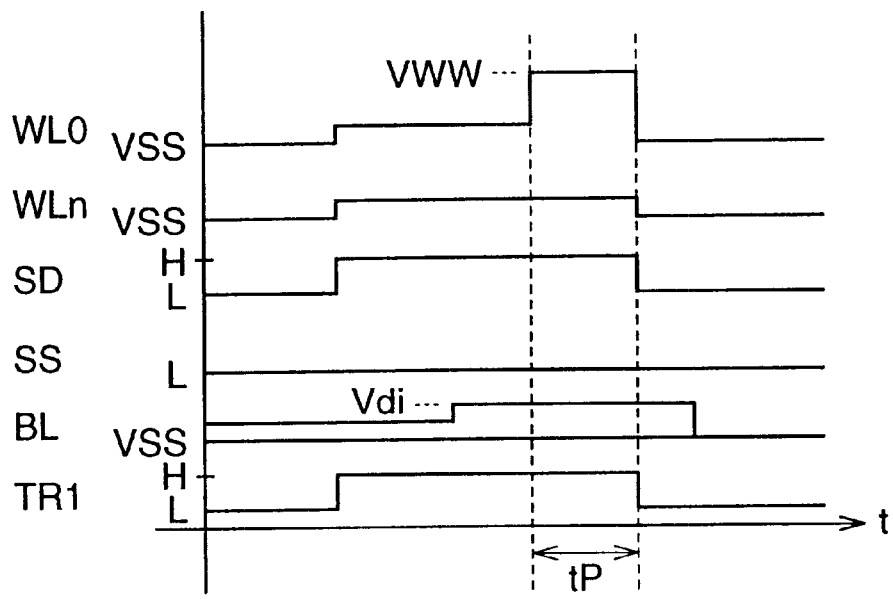
FIG. 5 is a timing chart illustrating data writing in row memory cell group MCLGO.

Referring to FIG. 5, at the time of unit writing operation, the gate electrode of transistor TR0 is at an H level, and transistor TR0 turns on. Accordingly, a bit line voltage controlled by sense latch circuit SEL0 is transmitted to bit line BL0. Drain select line SD is also at an H level and transistor T6 turns on, so that the potential of bit line BL0 is transmitted to sub-bit line SBL0. Since source select line SS is at an L level, source line SL0 of each memory cell MC0–MCn is open. Here, word line WL0 is regarded as the word line of the sector selected by control circuit 11, and the remaining word lines are regarded as non-selected word lines, among which word line WLn is shown representatively. Thus, a voltage amplitude VWW of the data writing pulse is applied to word line WL0 of the selected sector. However, since the data writing has been completed for memory cell MC0, an inhibit voltage Vdi is applied from sense latch circuit SEL0 to sub-bit line SBL0. Thus, in practice, the unit writing operation is not carried out for memory cell MC0, but is carried out for the remaining memory cells of the selected sector.

Referring again to FIG. 3, in order to determine whether the data writing is conducted properly, data is read out applying a prescribed threshold voltage Vth (step S4). Here, the data reading is carried out with threshold voltage Vth of Va.

Figure 6:
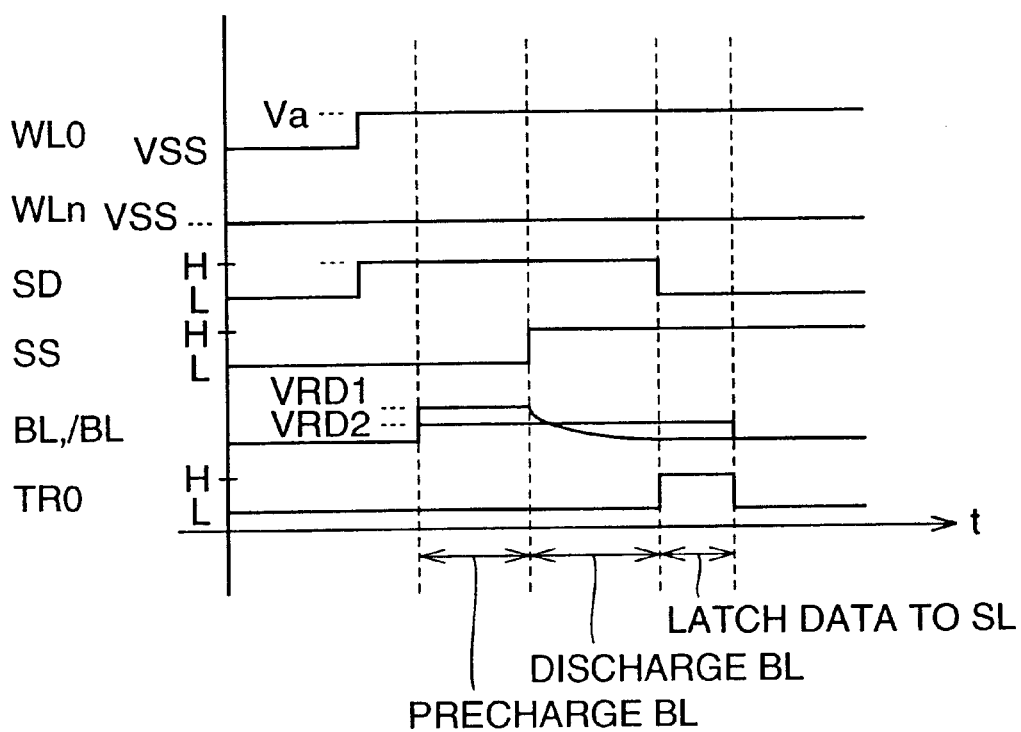
FIG. 6 is a timing chart illustrating data reading in row memory cell group MCLGO.

Referring to FIG. 6, at the time of the data reading, drain select line SD is at an H level and transistor T6 is turned on, and thus, bit line BL0 and sub-bit line SBL0 are conductive. Before the start of the data reading, a precharge voltage is supplied to bit lines BL and /BL. The precharge voltage level of bit line BL is VRD1, and the precharge voltage level of bit line /BL is VRD2. When source select line SS is turned on, source line SL is provided with ground voltage GSS. Here, word line WL0 corresponds to the selected sector, and the remaining word lines correspond to non-selected sectors, of which word line WLn is shown representatively. Threshold voltage Va is applied to the selected sector, so that the data reading is started. At this time, the memory cell with its threshold voltage not greater than Va for which the data writing has not been completed yet is turned on, so that the voltage precharged to the bit line is discharged to ground voltage GSS. By comparison, the memory cell with its threshold voltage greater than Va for which the data writing has been completed is not turned on, and the voltage precharged to the bit line is maintained. FIG. 6 shows that the data writing has not been completed yet for memory cell MC0.

After the discharge of the bit line, the stored data is discriminated by sense latch circuit SEL0. Specifically, a voltage of an H level is applied to the gate electrodes of respective transistors TR0, and the voltages of bit lines BL and /BL are input to sense latch circuit SEL0. Sense latch circuit SEL0 latches the data to perform the data reading.

Here, referring again to FIG. 2, in the case where data has been properly written into any one of the memory cells of the selected sector to threshold voltage Vth of at least Va (V), the corresponding bit line BL in memory cell array region MCLF is at an H level, maintaining the charges after the discharge. In this case, the voltage level of judgement line JL1 having been precharged to the H level is decreased to ground voltage GSS (L level), as transistor T2 included in the relevant bit line control circuit BLC is turned on. Accordingly, judgement signal AJL attains an H level via inverter IV1.

By comparison, in the case where the data writing has not been completed even for a single memory cell, the charges are not maintained after the discharge, and thus, every bit line BL attains an L level. In this case, the voltage level of judgement line JL1 precharged to the H level remains remains unchanged, since no transistor T2 is turned on. Accordingly, judgement signal AJL attains an L level via inverter IV1.

Returning to FIG. 3, a judgement is made based on the output result of this judgement signal AJL in step S5. Specifically, if judgement signal. AJL is at an H level, it is determined that at least one memory cell has been properly written, so that the data writing sequence of this judgement 1 is completed. The operation thus proceeds to the data writing sequence of next judgement 2. If judgement signal AJL is at an L level, it is determined NG as no memory cell has been written properly, and the operation proceeds to next step S6 after setting unit writing operation total N to N+1.

In step S6, it is determined how many times the data writing sequence has been repeated in judgement 1, and whether the unit writing operation total N is within a prescribed number L. If the total N has exceeded the prescribed number L, it is determined NG and the data writing sequence is terminated. If it is within the prescribed number L, the operation returns to step S1 to repeat the data writing sequence.

The data writing sequence of judgement 2 will now be described.

As explained above, if the unit writing operation is performed for the memory cell for which the data writing has already been completed, it will result in an over-written memory cell. Thus, the memory cell for which the data writing has been completed in the data writing sequence of judgement 1 is eliminated from the target for data writing in judgement 2 (step S7). Specifically, referring to FIG. 5, inhibit voltage Vdi is applied to bit line BL connected to the memory cell for which the data writing has been completed, so that the unit writing operation is not conducted for the relevant memory cell.

Next, to conduct further writing to the memory cells for which the data writing has not been completed yet, unit writing operation total N is determined, and voltage application time tP is set according to the determined total N with reference to the table in FIG. 4 (step S8).

For example, application time tP for the initial unit writing operation in the data writing sequence of judgement 2 is set to T2. Thereafter, application time tP is set to $T2 \times P2^{(N-K)}$ (T2: initial term, P2: power coefficient). Thus, the application time increases exponentially as the unit writing operation is repeated.

In step S9, the unit writing operation is conducted for the memory cells, with a prescribed voltage for application time tP set in step S8.

Next, in order to determine whether the data writing is conducted properly, a prescribed threshold voltage Vth is applied according to the timing sequence shown in FIG. 6 to read out the data (step S10). Here, the data reading is performed with threshold voltage Vth=Va.

In the case where all the memory cells have been properly written to the threshold voltages Vth of not smaller than Va (V), bit lines BL in memory cell array region MCLF all attain an H level since they maintain the charges after the discharge. Thus, complementary bit lines /BL all attain an L level. In this case, judgement line JL2 is maintained at an H level as precharged by precharge circuit 10, since no transistor T3 is turned on. Accordingly, judgement signal AJR of an L level is output via inverter IV2.

By comparison, if there is a memory cell for which data writing has not been completed, the corresponding bit line BL is at an L level, since it does not maintain the charges after the discharge. Thus, complementary bit line /BL corresponding to the relevant bit line BL is at an H level, so that the corresponding transistor T3 turns on. In this case, the voltage level of judgement line JL2 having been precharged to the H level is decreased to the ground voltage GSS level (L level), due to the transistor T3 turned on. Accordingly, judgement signal AJR of an H level is output via inverter IV2.

A determination is made based on the output result of this judgement signal AJR in step S11. Specifically, when judgement signal AJR is at an L level, it is determined that the data writing has been completed properly for all the memory cells, and the data writing sequence is completed. If judgement signal AJR is at an H level, it is determined NG, and the operation proceeds to next step S12 after setting unit writing operation total N to N+1.

In step S12, it is determined whether the unit writing operation total N is within a prescribed number M. If the total N is greater than prescribed number M, it is determined NG, and the data writing sequence is terminated. If the total N is within prescribed number M, the operation returns to S7 to repeat the data writing sequence.

According to the embodiment described above, it is possible to perform stable data writing despite the variation in data writing speed for each lot or before and after the data erasing and writing. In addition, judgement 1 increases the speed of the entire judgement even when the data writing is slow.

First Variation of Embodiment

In the embodiment described above, voltage application time tP in the data writing sequence of judgement 1 was constant, as shown in FIG. 4. By comparison, in the first variation, voltage application time tP is changed even during judgement 1, as shown in FIG. 7. Specifically, in judgement 1, voltage application time tP is set to $T1 \times P1^{(N-1)}$ (T1: initial term, P1: power coefficient) when unit writing operation total N>1. This enables relatively rapid data writing until one memory cell reaches prescribed threshold voltage level Va, which is followed by finer writing. Accordingly, it is possible to shorten the time required for the writing sequence, and also to perform the data writing with accuracy.

Second Variation of Embodiment

In the second variation, as in the first variation, voltage application time tP in the data writing sequence of judgement 1 is changed, as shown in FIG. 8. Specifically, application time tP is set to $T1 \times P1^{(N-1)}$ (T1: initial term, P1: power coefficient) when unit writing operation total N>1. Further, in the embodiment described above, voltage application time tP in the data writing sequence of judgement 2 was set regardless of the unit writing operation total N in the data writing sequence of judgement 1, as shown in FIG. 4. In the second variation, as shown in the table of FIG. 8, voltage application time tP in the data writing sequence of judgement 2 is set based on the unit writing operation total K required for the completion of the data writing sequence of judgement 1.

For example, voltage application time tP in the data writing sequence of judgment 2 is set by grouping the cases to: the case where the unit writing operation total K at the completion of judgement 1 is smaller than a prescribed number A; the case where total K at the completion of judgement 1 is equal to or greater than prescribed number A and smaller than another prescribed number B; and the case where total K is equal to or greater than prescribed number B. Here, prescribed number A is smaller than prescribed number B. Specifically, in the case where unit writing operation total K at the completion of judgement 1 is smaller than prescribed time A, voltage application time tP is set to $T2 \times P2^{(N-K)}$ (T2: initial term, P2: power coefficient). If total K is equal to or greater than prescribed number A and smaller than prescribed number B, application time tP is set to $T3 \times P3^{(N-K)}$ (T3: initial term, P3: power coefficient). If total K is equal to or greater than prescribed number B, application time tP is set to $T4 \times P4^{(N-K)}$ (T4: initial term, P4: power coefficient). Here, T2<T3<T4, and P2<P3<P4. According to such grouping, writing pulse application time tP can be set at narrower intervals for a sector whose writing speed is fast. By comparison, for the sector whose writing speed is slow, writing pulse application time tP can be set at relatively long intervals.

Accordingly, by using the table shown in FIG. 8, it is possible to set voltage application time tP according to the data writing characteristic of each memory cell. This allows the unit writing operation to be done corresponding to the variation in data writing characteristics of the memory cells, and further ensures high-precision data writing.

Third Variation of Embodiment

In the embodiment and the first and second variations thereof, various kinds of setting of data writing pulse application time tP of a prescribed voltage were described. As explained above, however, the unit writing operation condition is set with voltage amplitude VWW and application time tP of the data writing pulse. Thus, in addition to pulse application time tP of a prescribed voltage, voltage amplitude VWW can be made variable, which is described in the third variation.

Figures 9, 10:
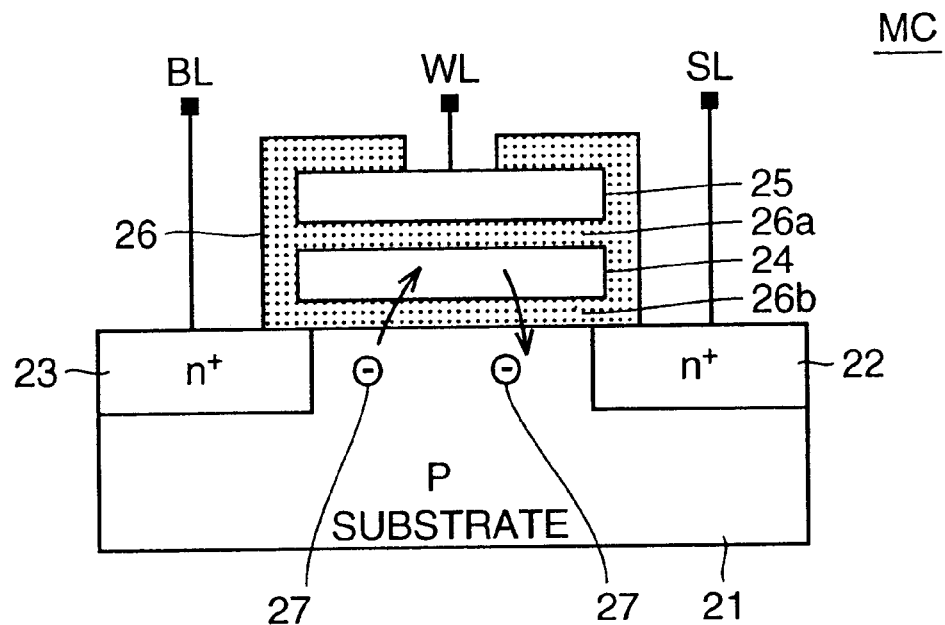
FIG. 9 is a table stored in unit 15 for use in setting a voltage amplitude level.
FIG. 10 schematically shows a structure of memory cell MC in a flash memory.

For example, in the third variation, it is possible to perform the unit writing operation in the data writing sequence of judgement 1 according to the table shown in FIG. 8 as in the second variation, and to perform the data writing sequence of judgement 2 by further setting voltage amplitude VWW with reference to FIG. 9.

Specifically, in the case where unit writing operation total K at the completion of judgement 1 is smaller than a prescribed number A, the voltage amplitude is set to VWW1. If the total K at the completion of judgement 1 is equal to or greater than prescribed number A and smaller than another prescribed number B, the voltage amplitude is set to VWW2. If the total K is equal to or greater than prescribed number B, the voltage amplitude is set to VWW3. Here, VWW1<VWW2<VWW3.

According to the third variation, the data writing can be performed with higher accuracy than in the second variation. In addition, the time required for the data writing sequence can further be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:
   a memory cell array region including
      a plurality of memory cells arranged in rows and columns for storing data in a non-volatile manner,
      a plurality of word lines provided corresponding to the rows of said memory cells, and
      a plurality of bit lines provided corresponding to the columns of said memory cells; and
   a control unit controlling data writing to selected ones of said plurality of memory cells corresponding to selected one of said plurality of word lines as a target of said data writing,
   said control unit performing
   designation of a unit writing operation repeated until said data writing is completed,
      a first judging operation, conducted every time said unit writing operation is finished, to confirm whether said data writing is completed for at least one of said selected memory cells, and
      a second judging operation, conducted every time said unit writing operation is finished after said first judging operation has confirmed the completion of the data writing for the at least one of said selected memory cells, to confirm whether said data writing is completed for all said selected memory cells.

2. The non-volatile semiconductor memory device according to claim 1, wherein said control unit counts a number of times of the designation of said unit writing operation, and terminates the designation of said data writing to said selected memory cells at the time when the number of times of the designation of said unit writing operation that is repeated until said first judging operation confirms the completion of said data writing for the at least one of said selected memory cells has reached a prescribed number of times.

3. The non-volatile semiconductor memory device according to claim 1, further comprising a storage unit for storing a first setting condition of said unit writing operation repeated until said data writing is completed for at least one of said selected memory cells, and a second setting condition of said unit writing operation repeated, after the completion of said data writing for the at least one of said selected memory cells, until said data writing is completed for all said selected memory cells, wherein
   said first setting condition and said second setting condition are different from each other.

4. The non-volatile semiconductor memory device according to claim 3, wherein
   said control unit counts the number of times of the designation of said unit writing operation, and designates said unit writing operation based on either one of said first and second setting conditions stored in said storage unit, and
   in said storage unit, each of said first and second setting conditions includes a voltage amplitude of a pulse voltage signal being applied to said selected word line in said unit writing operation and a voltage application time of said pulse voltage signal,
   said first setting condition having said voltage amplitude set constant and said voltage application time set constant, and
   said second setting condition having said voltage amplitude set constant and said voltage application time varied according to the number of times of the designation of said unit writing operation.

5. The non-volatile semiconductor memory device according to claim 3, wherein
   said control unit counts the number of times of the designation of said unit writing operation, and designates said unit writing operation based on either one of said first and second setting conditions stored in said storage unit, and
   in said storage unit, each of said first and second setting conditions includes a voltage amplitude of a pulse voltage signal being applied to said selected word line in said unit writing operation and a voltage application time of said pulse voltage signal,
   said first setting condition having said voltage amplitude set constant and said voltage application time varied according to the number of times of the designation of said unit writing operation, and
   said second setting condition having said voltage amplitude set constant and said voltage application time varied according to the number of times of the designation of said unit writing operation.

6. The non-volatile semiconductor memory device according to claim 1, further comprising a storage unit for storing a setting condition of said unit writing operation that is repeated, after said first judging operation has confirmed the completion of said data writing for the at least one of said selected memory cells, until said data writing is completed for all said selected memory cells, wherein
   said control unit further counts the number of times of the designation of said unit writing operation, and designates said unit writing operation based on said setting condition according to the number of times of the designation of said unit writing operation required for the completion of said data writing of the at least one of said selected memory cells.

7. The non-volatile semiconductor memory device according to claim 6, wherein in said storage unit, said setting condition has a voltage application time of a pulse voltage signal being applied to said selected word line in said unit writing operation and a voltage amplitude of said pulse voltage signal varied according to the number of times of the designation of said unit writing operation repeated until the completion of said data writing of the at least one of said selected memory cells.

8. The non-volatile semiconductor memory device according to claim 6, wherein in said storage unit, said setting condition has a voltage amplitude of a pulse voltage signal being applied to said selected word line in said unit writing operation and a voltage application time of said pulse voltage signal varied according to the number of times of the designation of said unit writing operation repeated until the completion of said data writing of the at least one of said selected memory cells.

* * * * *